United States Patent
Abramovici

(10) Patent No.: US 7,137,086 B2
(45) Date of Patent: Nov. 14, 2006

(54) ASSERTION CHECKING USING TWO OR MORE CORES

(75) Inventor: Miron Abramovici, Berkeley Heights, NJ (US)

(73) Assignee: DAFCA, Inc., Framingham, MA (US)

( * ) Notice: Subject to any disclaimer, the term of this patent is extended or adjusted under 35 U.S.C. 154(b) by 162 days.

(21) Appl. No.: 10/956,854

(22) Filed: Oct. 1, 2004

(65) Prior Publication Data
US 2006/0031807 A1    Feb. 9, 2006

Related U.S. Application Data

(60) Provisional application No. 60/585,769, filed on Jul. 6, 2004.

(51) Int. Cl.
*G06F 17/50* (2006.01)
(52) U.S. Cl. .................................. 716/4; 716/6; 716/17
(58) Field of Classification Search .................... 716/1, 716/4, 6, 17, 18
See application file for complete search history.

(56) References Cited

U.S. PATENT DOCUMENTS 6,311,149 B1 * 10/2001 Ryan et al. .................. 703/21

6,484,280 B1   11/2002 Moberly
6,665,817 B1   12/2003 Rieken

OTHER PUBLICATIONS

Koranne S: "A Novel Reconfigurable Wrapper for Testing of Embedded Core-Based SOCs and Its Associated Scheduling Algorithm", Journal of Electronic Testing, Kluwer Academic Publishers, vol. 18, No. 4-5, Sep. 2002.
D. Kelf and B. Tabbara, "Assertion-Based Verification and Debug in SoC Design," 2003 System-on-Chip Online Design Conf., www.soconline.com.
G.J. van Rootselaar, B. Vermeulen, "Silicon Debug: Scan Chains Alone Are Not Enough" in Proceedings International Test Conference, Sep. 1999.

* cited by examiner

*Primary Examiner*—Thuan Do
(74) *Attorney, Agent, or Firm*—Henry T. Brendzel

(57) ABSTRACT

An SoCs with functionally reconfigurable modules employing the modules to configure circuitry for performing assertion checking. Both at-speed assertion checking as well as continuous single step (CSS) assertion checking is disclosed. Advantageously, the checking of the various cores within the SoC is carried out concurrently, in subsets of the entire set of assertions that need to be checked out. Advantageously, bit extraction and injection is used in CSS assertion checking to permit use of relatively small registers for the assertion checking of each subset of assertions.

24 Claims, 4 Drawing Sheets

A.L.: ASSERTION LOGIC

ASSERTION CHECKING USING TWO OR MORE CORES

RELATED APPLICATION

This application is related to U.S. patent application Ser. No. 10/425,101, filed Apr. 28, 2003, U.S. application Ser. No. 10/920,706, filed Aug. 30, 2004, and U.S. Provisional Application No. 60/585,769, filed Jul. 6, 2004 which are hereby incorporated by reference.

BACKGROUND

This invention relates to integrated circuits and, more particularly, to functional testing and debugging of integrated circuit designs.

Some present day designs of integrated circuits (ICs) comprise a plurality of module, or core, designs (and associated design layouts) that are interconnected within the integrated circuit to create a whole. Such ICs are sometimes referred to as "systems on a chip" (SoCs). The designed SoCs may include core designs that the party designing the integrated circuit has created before, core designs purchased from another party, and core designs that are created specifically for the designed SoC; sometimes is referred to as user defined logic (UDL) block. In connection with the previously created designs, it is recognized that there may exist outputs and/or inputs that are not needed for the specific SoC design undertaken, and those effectively constitute points of access of the core—in addition to the functionally employed inputs and outputs—that may be used for testing the core as well as the entirety of the SoC design.

The aforementioned Ser. No. 10/425,101 patent application discloses a beneficial design approach for SoCs, where each core is encompassed with a wrapper that includes a functionally reconfigurable module (FRM). A wrapper is a collection of elements, including circuit interface elements between essentially every input terminal of the core and circuitry outside the core, and between essentially every output terminal of the core and circuitry outside the core. The FRM can be configurably connected to any of the circuit interfaces, and can also be configured to realize any function. Spare leads are additionally included to permit connectivity from the FRM directly (i.e., not through the circuit interface elements) to circuitry outside the wrapper. The circuitry outside the core can be another wrapper, a UDL block, inputs of the IC, or outputs of the IC.

FIG. 1 depicts an arrangement in accord with the disclosure presented in the aforementioned patent application where an SoC includes core 10 that is wrapped by wrapper 11, core 20 that is wrapped by wrapper 21, and core 30 (a UDL block) that is wrapped by wrapper 31. Illustratively, core 10 has three inputs and four outputs (12, 13, 14, and 15). Core 20 has four inputs, three outputs (22, 23, and 24), and UDL 30 has three inputs and two outputs (32, and 33) that are connected to the SoC output terminals of the IC. The blocks labeled "I" are the aforementioned circuit interface elements.

Each interface element that provides a signal to a core is adapted to configurably provide either an incoming signal (the signal shown in the FIG.) or a signal provided by the associated FRM (not shown in the FIG.). Similarly, each interface element that outputs a signal from a wrapper is adapted to configurably provide either an output of the core (the signal shown in the FIG.) or a signal provided by the associated FRM (not shown in the FIG.).

In is noted that in the illustrative SoC of FIG. 1, core 20 has one output (25) that is available but is not needed for the FIG. 1 SoC design. This intends to illustrate the above-mentioned notion that an obtained core layout that had been previously designed might have inputs and/or outputs that were needed for the application for which the core was designed but in the FIG. 1 application those might not be needed.

In addition to the necessary signal connections between wrappers 11 and 21, and between wrappers 21 and 31, including spare leads, the FIG. 1 SoC includes manager circuit 40 through which control is exercised over the SoC. It accepts a test clock, a control signal, and information through a serial Scan-in input. It receives Scan-out (SO) information (serially) from the SoC via lead 42 and is adapted to output that information, as directed by control 40, on the lead SCAN OUT. In turn, subject to desired processing within manager 40, the manager applies the test clock signal to each of the wrappers, Not shown in FIG. is a clock distribution system that allows the test clock to replace the functional system clock(s). The manager 40 could be compatible with, for example, the JTAG controller specified in the "Standard Test Access Port and Boundary-Scan Architecture," IEEE Standard P1149.1, 1990.

In addition, the serial SI input of manger 40 is applied to wrapper 11. The SO output of wrapper 11 is connected to the SI input of wrapper 21. The SO output of wrapper 21 is connected to the SI input of wrapper 31, and the SO output of wrapper 31—which is the Scan-out signal of the FIG. 1 SoC—is connected to the manager 40. These connections establish a serial communication mechanism among the wrappers and the manager 40, which can be used to configure the FRMs or to send data to, and receive data from, the circuits configured in the wrappers. This communication mechanism could be compatible, for example, with the mechanism described in "Standard for Embedded Core Test" IEEE Standard P1500, 2003. Alternative communication means, such as a special-purpose debug bus, are also possible, and their nature is not essential for the disclosed innovation.

A useful technique for checking the design of integrated circuits (ICs) is called assertion checking. In assertion checking, a collection of conditions is identified that are expected to hold true at any time during the operation of a properly working SoC. The model of the SoC being tested can thus be simulated by application of various input test vectors, and its signals are checked against the collection of assertions. The signals checked by an assertion may include any internal signal. When an assertion "fires," indicating that the asserted condition that should be met is not met, simulation can stop and the party performing the testing can attempt to analyze the reason for the assertion's failure.

While assertion checking in simulation is a widely used technique, and a simulation run may use hundreds of assertions, employing assertions for debugging hardware is much more constrained.

In general, any assertion can be implemented in hardware, e.g., within the manufactured SoC, but this is a costly approach because it permanently reduces the amount of "real estate" that is available for the normal operation of the SoC. Moreover, in addition to the effective cost associated with appropriated chip "real estate" to implementing hundreds of assertions in the SoC, this solution is not flexible, since the functional problems occurring in silicon often require the implementation of new assertions.

A more economical solution involves using additional hardware to observe many internal signals, run-time programmable logic to select a subset of these, and a run-time programmable assertion logic checking the selected subset of signals, and a clock-control logic to stop the operation of the SoC when an assertion fires. Such a system is illustrated in the paper "Silicon Debug: Scan Chains Alone Are Not Enough" by Gert Jan van Rootselaar and Bart Vermeulen, published in the Proc. International Test Conf., 1999. However, this solution does not provide the desired flexibility, since new signals and new conditions to be checked cannot be added at run-time. As an aside, in this paper the assertions are referred to as "breakpoints." The described system is an example of at-speed debug, where the tested SoC is exercised in its normal operational mode, with a clock that is at the normal operational speed. The clock is not stopped while the assertions are checked, unless an assertion fires, i.e., fails.

An SoC may have several clock domains, each one having a different system clock signal. Firing of an assertion may stop one or all the functional clocks. In the following, clock stopping may refer to either case.

Usually all the functional registers of an SoC are setup so they can work as scan chains in test mode. Typically, a scan chain has a serial input (SI), a serial output (SO), and a scan-enable control input (SE). When SE is asserted, the register operates as a scan chain, otherwise data are loaded in parallel. (Other scan design techniques exists, but their operation is similar.) SE is typically shared between all registers in the same clock domain. For manufacturing test, the scan chains are separately operated to scan in test data and to scan out the captured data. The same scan chains are also used for debug—when the functional clock has been stopped as a result of an assertion firing (or for any other reason), the internal state of the hardware can be examined (manually or by software) by scanning out all the scan chains. For this operation the test clock shown in FIG. 1 as TEST CLK replaces the system clock, and all the scan chains are connected together in a single chain, connected to the pins SCAN IN and SCAN OUT of the test controller 40 of FIG. 1. Scanning back in the scanned-out state allows restoring the state to restart the normal operation from the last state; the scan-out and the scan-in operations may proceed concurrently by connecting the scan-out pin back to the scan-in pin to achieve a circular scan. If desired, the scanned-out state can be modified before the scan-in, so that the normal operation will restart from a different state. This mode of debug is called single-step debug.

Single-step debug is typically done manually under user control only at several points during the test, because performing scan-out and scan-in operation after every test vector would require too much time. To illustrate, if the test has 100,000 vectors, and the SoC has 500,000 flip-flops, and the test clock runs at 10 MHz, doing a full-scan dump at every cycle would make the entire test run in about two hours. Hence with the current state of the art, one cannot check assertions involving flip-flops on scan-chains, unless these flip-flops are made directly observable (allowing checking through at-speed assertion checking).

SUMMARY

An advance in the art is realized by creating SoCs with functionally reconfigurable modules and employing the modules to configure circuitry for performing assertion checking. Since checking assertions with on-chip logic is much faster than checking with external software, the disclosed approach makes possible at-speed assertion checking for at-speed debug. For assertions that involve internal flip-flops on scan chains, the disclosed approach provides the Continuous Single Step (CSS) debug mode, which makes possible automatic checking such assertions after every functional clock.

For an at-speed assertion checking embodiment, each of the cores can be treated as a separate entity with inputs and outputs that can be subjected to assertion checks. The tests are performed in a single FRM that is included in the SoC or, more advantageously, in a number of FRMs that are included in the SoC where each is associated with a particular core of the plurality of cores in the SoC; for example, within a wrapper that encompasses each core. For a CSS assertion checking embodiment, the SI and SO leads of each scan chain of each core are connected to a FRM that is included in the SoC, and a bit extractor/bit injector is implemented in the FRM to efficiently carry out the assertion checking pertaining to each of the associated cores.

DETAILED DESCRIPTION

As described in the aforementioned Ser. No. 10/425,101 application, an FRM can be realized with field-programmable logic arrays (FPLAs) in a conventional manner, and the variety of digital circuits that can be created within an FPLA is essentially limitless. We realized and discovered that this powerful structure can be applied to provide a novel solution to the problem of efficiently implementing assertion checking in hardware by creating assertions in the reconfigurable logic contained in wrappers. By repeatedly reusing the reconfigurable logic within the FRMs to implement different subsets of assertions, one subset of assertions at a time, all of the necessary assertions can be checked. Advantageously in accord with the principles disclosed herein, all of the assertions of a subset are checked concurrently.

Figure 2:
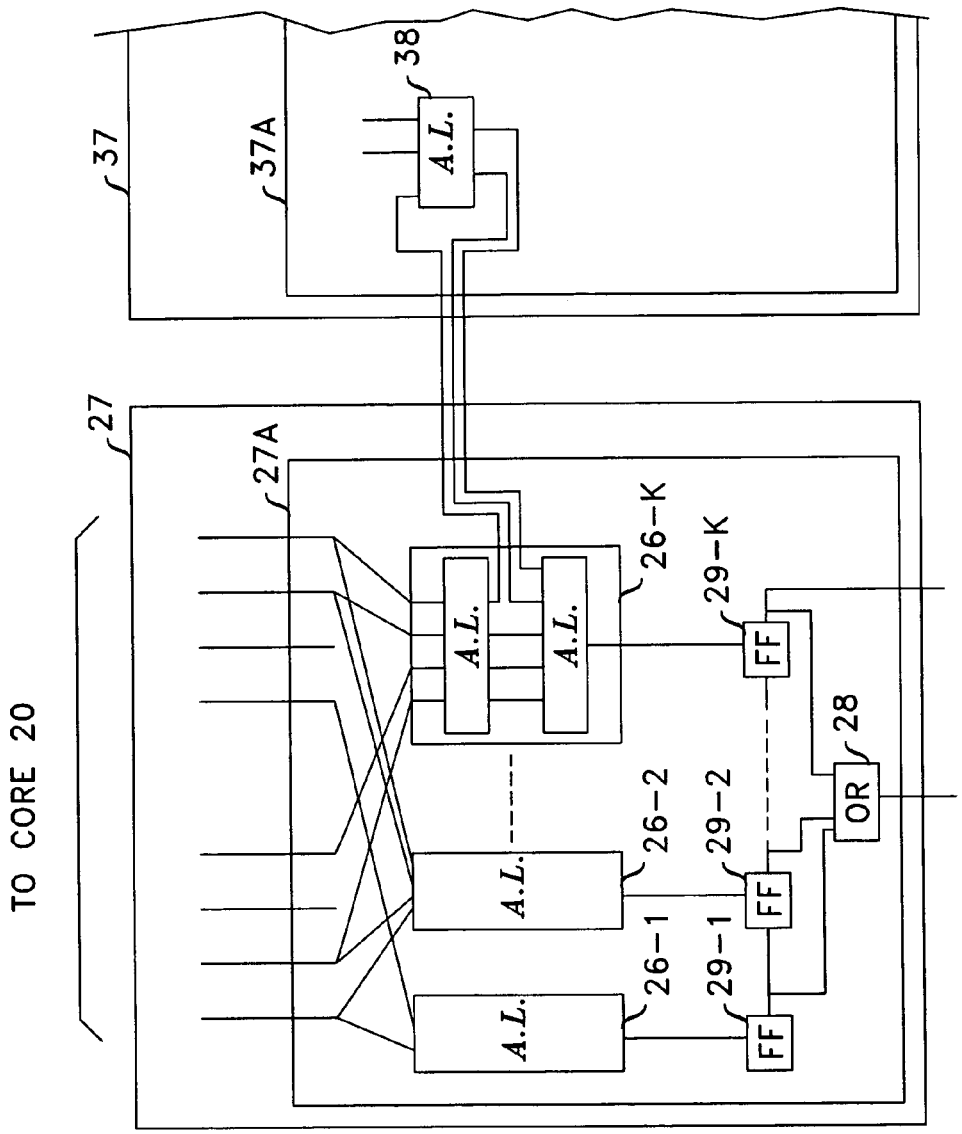
FIG. 2 shows an at-speed assertion checking arrangement.

FIG. 2 presents one illustration of assertion checking circuitry 27A within wrapper 27 that is created for core 20 for at-speed assertion checking. Circuitry 27A comprises assertion logic modules, 26-1, 26-2, . . . 26-K, where each implements a check of one assertion. The plurality of modules 26-i is created from the fabric of the FRM through reconfiguration of the FRM; that is, through installing specific states in various flip-flops within the FRM that determine the functionalities of the FRM. Circuits 26-i may be combinatorial or sequential.

As may be observed from the illustration that the bulk of the assertion checking logic for core 20 is included in FRM 27. One assertion checking module that checks an assertion relative to core 20 but is not included in circuitry 27A is assertion logic module 38, which is implemented within FRM 37. To effect the necessary connection, spare leads between FRM 27 and FRM 37 are employed. The output of module 38 is fed back to FRM 27 to help develop the output of assertion logic module 26-K. As depicted, module 38 also utilizes two functional signals from UDL 30. Because of this, it is absolutely necessary to have some connectivity between FRM 27 and FRM 37. It should be realized, however, that module 38 might need to be implemented within FRM 37 simply because FRM 27 does not have sufficient circuitry for implementing all of the assertion logic modules that are required for the chosen subset of assertions. This can be done, of course, only if there are (a) an adequate number of spare leads that enable the necessary subset of assertion logic modules to implement some of the modules in FRM 73, and (b) FRM 73 has some spare capacity that can be used.

The output developed by each of the assertion logic modules is a logic 0 as long as the assertion holds, and logic 1 the moment the assertion fires (fails). To avoid transients on the output of the assertion logic, the outputs of logic modules 26-i are loaded into flip-flops 29-i at a time when the assertion signals have stabilized. The loading of flip-flops is done by the same system clock that is active in core 20. In FIG. 2, flip-fops 29-i can are arranged as a scan register that can be read out under control of manager 40. The outputs of flip-flops 29-i are applied to OR gate 28. Whenever any of the assertions fires, gate 28 assumes the logic level 1. The outputs of several such gates from different cores may be further ORed to obtain one global "ASSERTION_FAILED" signal for the entire SoC. This global "ASSERTON_FAILED" OR circuit (not shown in FIG. 2) is implemented in any of the FRMs that has available capacity. This signal may be used as an input to a clock control circuit to stop the clocking of the SoC when any assertion fails, and as an output of the SoC to inform the external testing environment about the assertion failure. After one or more of the assertions fired, scanning out the contents of flip-flops 29-i provides information about the assertion, or assertions, that fired. Alternatively, the ASSERTION_FAILED signal may be recorded into a control register which may be subsequently read out via manager 40.

As implied by the above, one might expect that only a subset of all of the assertions that might be desired to test will be checked at any one testing iteration because of the size limitations of the FRM fabric. An SoC that passes all of the assertions that are configured into the FRM, i.e., that passes the configured subset of assertions, can then be re-tested with another subset of the desired assertions.

Figure 3:
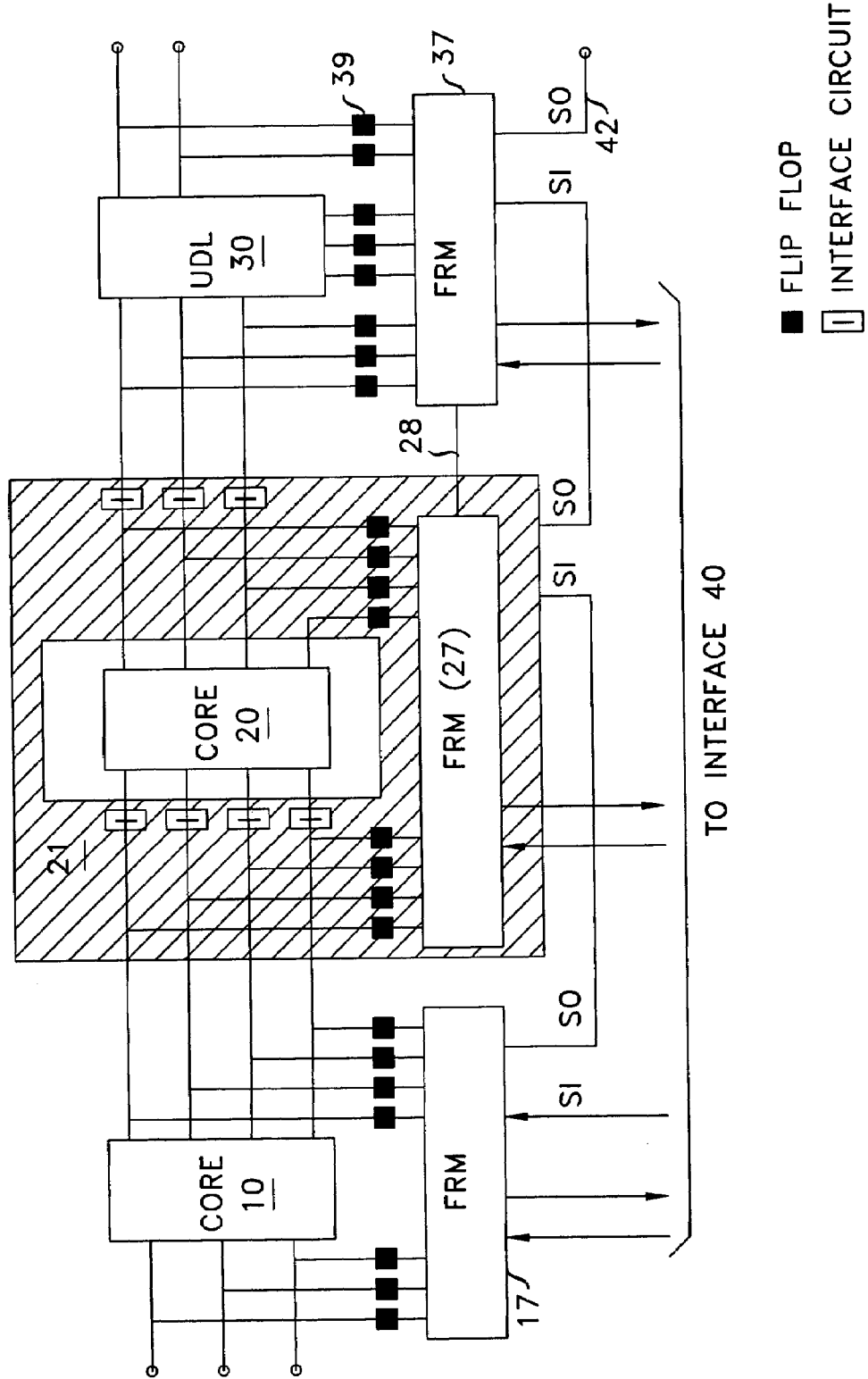
FIG. 3 show an arrangement with state-capturing flip-flops for at-speed assertion checking.
Figure 4:
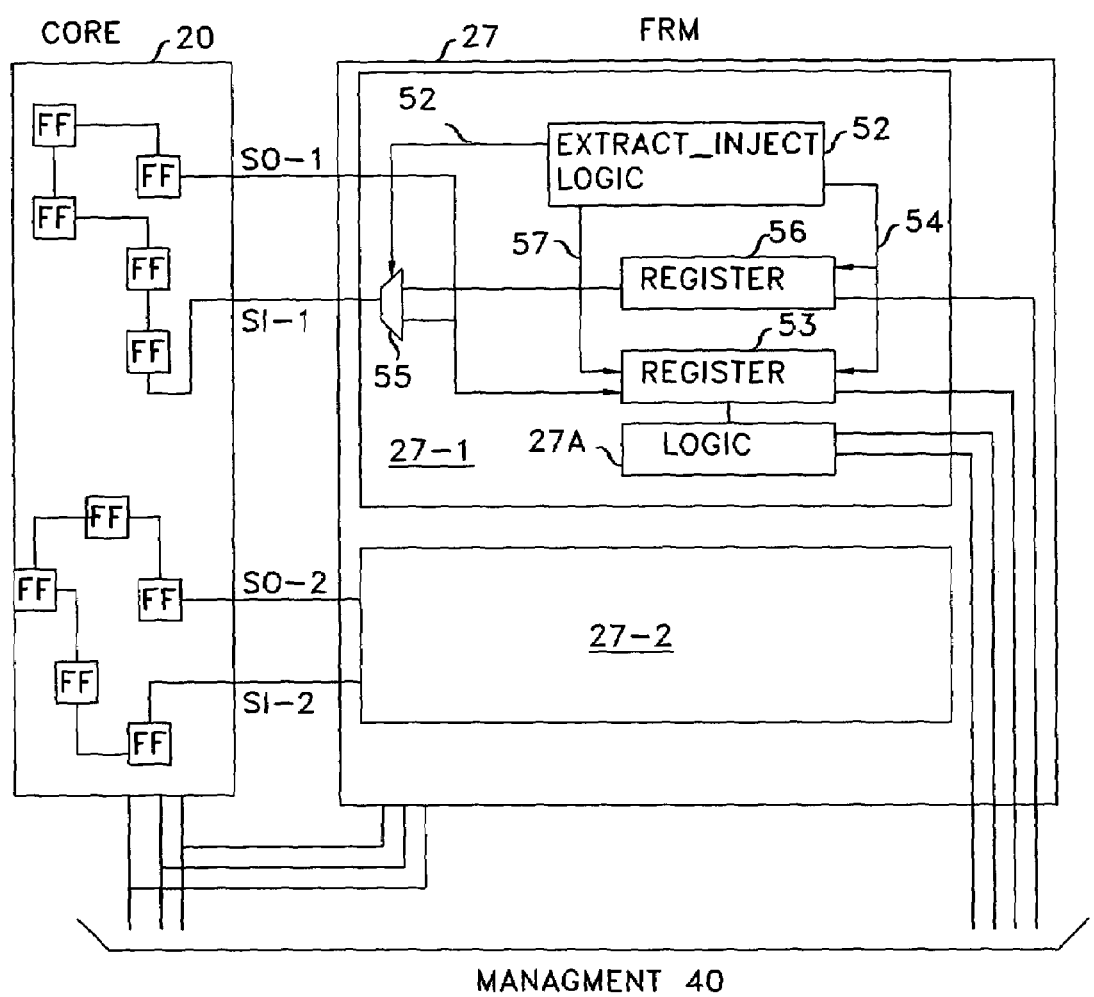
FIG. 4 shows the circuitry in an FRM for CSS assertion checking.

FIG. 3 presents a somewhat different embodiment where core 10 is not wrapped, and neither is UDL 30. This is to demonstrate that the principles disclosed herein do not require wrapping, but only making the signals needed for at-speed assertion checking available to the FRMs implementing the assertion logic. FIG. 4 includes the additional feature of having all inputs that are applied to the FRMs for the at-speed assertion checking pass through flip-flops, such as flip-flop 39. The flip-flops are included in recognition of the fact that signals on the output leads of the cores need time to settle and, therefore, it is advantageous to capture the signals once they settle so that the assertion checking logic within the FRMs would have a full clock period of valid data.

From the above it should be readily apparent that significant advantages are realized from the almost total flexibility that the FIG. 3 structure affords. Many more assertions can be at-speed tested than in the prior art, and the hardware within the SoC that is used for testing can be reused for different tests in subsequent testing iterations, or for the different other purposes disclosed in the aforementioned Ser. No. 10/425,101 patent application.

Although, as mentioned above, at-speed assertion checking in accord with the principles disclosed herein is significantly better than, for example, the aforementioned Philips breakpoints checking, it is also appreciated that it does not provide access to the all of the internal variables within each core.

In accord with the principles disclosed herein, the single-step debug approach of the prior art is improved with an on-chip single-step assertion checking approach that makes intimate use of FRMs included within the IC, and which we call Continuous Single Step (CSS) assertion checking.

In CSS, the SoC's testing is divided into intervals that are divided into sub-intervals. Each interval consists of
 a first subinterval that comprises a single system clock "tick" (cycle), which advances the SoC from a current state to a next state;
 a second sub-interval that comprises of a plurality of test clock ticks that are sufficient in number to extract the required bits from scan chains internal to cores without modifying the state of the SoC;
 a third sub-interval that is devoted to checking assertions, and optionally computing new state information; and
 an optional fourth subinterval that comprises a plurality of test clock ticks, as in the second sub-interval, during which time new state information computed during the third subinterval, is injected into scan chains internal to cores.

Note that bits are extracted from the various cores of the SoC concurrently during the second subinterval, that all assertions are checked concurrently during the third sub-interval, and that all bit injections are done concurrently during the fourth subinterval. If an assertion fires during the third subinterval, its relevant data (such as the values of the checked signals) are recorded in flip-flops located in a wrapper and these data may be later scanned out of the SoC for further analysis.

It should also be noted that operating in the CSS mode is also very effective because the SoC can be set to any desired state as a starting point for subsequent testing; for example, setting the SoC to the state that it should have been in but for the error that fired an assertion.

FIG. 4 illustrates an arrangement where a core has two scan chains residing in the same clock domain and sharing a common SE control. The first scan chain has leads SI-1 and SO-1, and the second scan chain has leads SI-2 and SO-2. For manufacturing test, the SI and SO leads are connected to pins of the SoC via an access mechanism, but these connections are not shown in FIG. 2, where these pins are controlled by the FRM 27. For sake of simplicity it is assumed that the two scan chains are of equal length. Since the SI and SO leads of both chains are applied to FRM 27, it is always possible to add dummy flip-flops within the FRM in that rather than connecting the inputs of the wrappers to the FRM to equalize the two scan chains, if they are not equal in length. Given that core 20 has two scan chains, FRM 27 in FIG. 5 has two SCC logic elements: 27-1 and 27-2. Structurally, the elements 27-1 and 27-2 are the same. The following explanation addresses only element 27-1, for sake of brevity.

Figure 1:
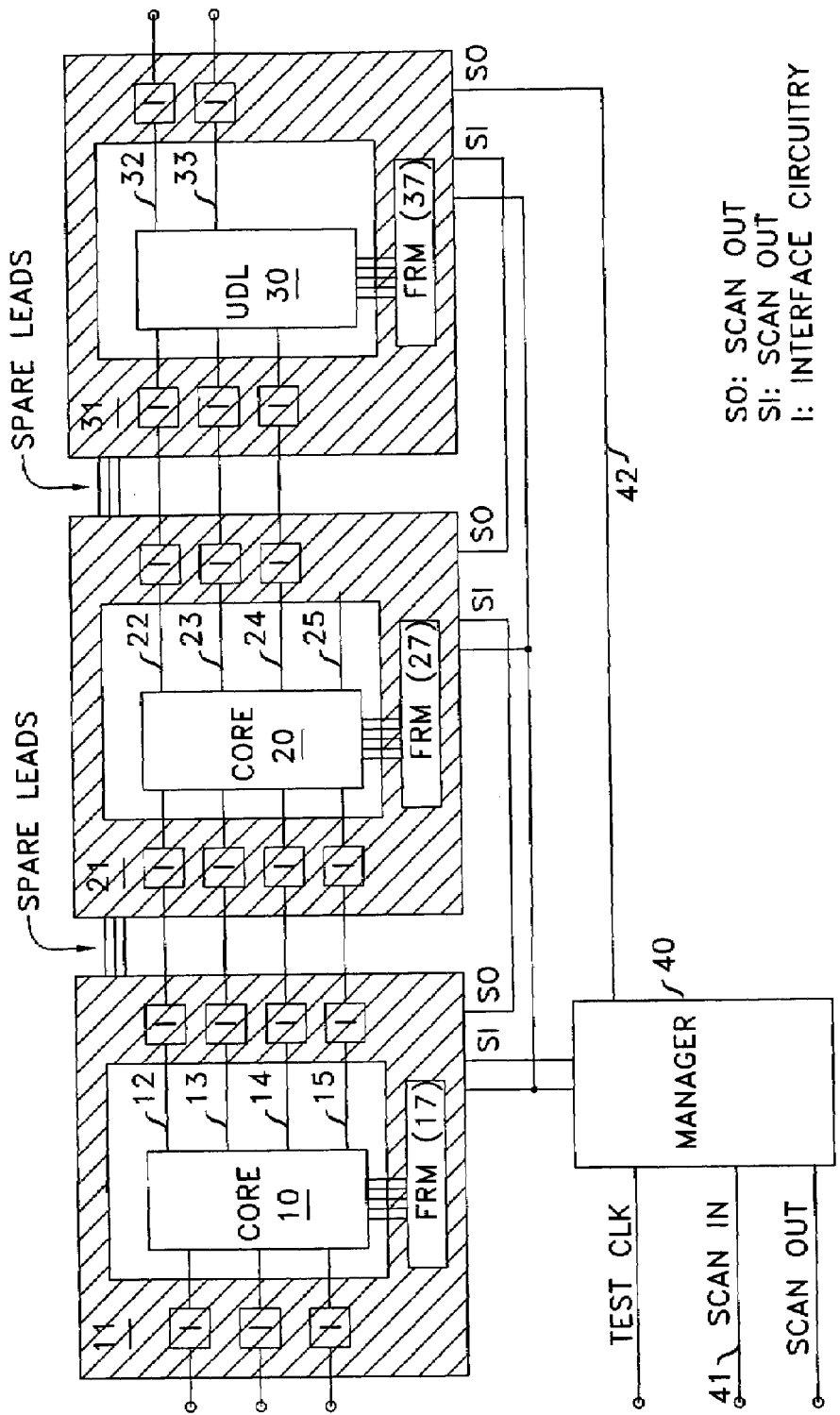
FIG. 1 shows an SoC arrangement that includes three cores, one of which is a UDL, and other of which has an available output lead that is not used.

To check an assertion that involves values of some flip-flops in the scan chain, in accord with the principles disclosed herein the scan chain is shifted out in the second subinterval. The bits that are needed for testing the subset of assertions that pertain to this scan chain are captured and stored in the shift register 53. The assertions are checked in logic element 27A is the same way as in the FIG. 2 arrangement. Of course, the assertion logic 27A may also check other core signals made available to the FRM 27, in addition to the bits extracted from the scan chains, in the same way as in FIG. 2. All registers within the FRM, such as 53, 56, and the flip-flops in the assertion logic 27A, are connected serially as a scan chain that is part of the wrapper scan chain illustrated in FIG. 1, and hence can be accessed by manager 40. These connections are not shown in FIG. 5.

To perform the necessary actions, EXTRACT-INJECT logic module 52 is configured or programmed to recognize when the bits of particular flop-flops appears at the SO output of the scan chain. The particular bits that need to be extracted and captured are known from the subset of assertions that are to be checked. The positions of these desired bits is known from knowledge of the core and how it configures its internal flip-flops into the scan chains, and from knowledge of the subset of assertions that are to be tested. The two sets of knowledge translate to an identification of a sequence of bits that need to be extracted from the sequence of bits that flow out of the SO-1 terminal of the scan chain, for example, the $5^{th}$, $28^{th}$, . . . , and the $111^{th}$ bits.

For bit extraction, block 52 sets signal 58 to 0, so that the SO-1 is connected to SI-1 via the multiplexer 55. In this way the first scan chain realizes a circular shift. There are many ways in which bit extractor logic block 52 can be constructed to identify such appearances. One very simple way is to configure an addressable memory that stores the numbers of the identified sequence; in the example above, the memory stores the values 5, 28, . . . 111. Additionally, there is one counter A that advances with each test clock, a counter B that addresses the memory, and a comparator responsive to the output of the memory and to counter A. Thus, when the first entry of the memory is retrieved (e.g., 5), the comparators fires when counter A reaches the value 5, indicating that the fifth bit of the scan chain is available. At that time module 52 sets control signal 54 to the value that enables register 53 to shift, causing it to capture the fifth bit. The same signal also enables counter B to increment, advancing the address and causing the memory to output its second entry, i.e., 28. The process continues until the $28^{th}$ bit arrives and it is shifted in register 53, etc. After the circular shift of the scan chain is complete, counters A and B are reset to 0, and module 52 sets output signal DONE on lead 57 to 1, indicating that all of the required bits have been extracted and the state of the register has been restored. At this point logic element 27A can perform the asserting checking. [signal 57 should be fed to logic 27A, not to register 53]

Obviously, since the number of flip-flops whose states need to be scanned out is smaller in a single scan chain of a core than in the entire SoC, and since the scan chains of the individual cores are scanned out concurrently, the number of clock ticks that are needed in the second and fourth sub-intervals is basically equal to the length of the longest scan chain, and thus is smaller in the arrangement disclosed herein as compared to prior art single-step debug, where all scan chains are connected serially for a full scan dump. Additionally, because the processing of the extracted values is done in FRMs, there is no need to scan out the raw contents of the internal registers, as done in prior art.

Register 56 is included for bit injection. Bit injection is the means by which the current state of the SoC can be changed. For bit injection, the bits to be injected are stored in the register 56, and the EXTRACT_INJECT control module 52 is configured or programmed to recognize the positions of the bits that need to be replaced. The operation of control module 52 is essentially identical with respect to extracting bits from register 56 and applying them to SI-1 input via multiplexer 55 as its operation relative to register 53. Of course, during the time that the bits are inserted into SI-1, EXTRACT-INJECT control module 52 inverts the control signal 58 that is applied to multiplexer 55.

It is noted that there is no requirement for bit injection to follow the bit extraction of the second subinterval and the assertion checking of the second interval. The bit injection can occur concurrently with the bit extraction. However, it may be desirable to assess the results of the assertion checking and to modify the state of the SoC based on this assessment. Therefore, the bit injection may, at least in some embodiments, take place in the optional fourth subinterval, as described above.

It is also noted that the modification of the current state by a new state represented by the contents of register 56 does not have to follow a failed assertion check. It can simply be a conditional states change that might, upon the mere occurrence of a given state. This would occur without interruption, essentially automatically changing a part of the state transition graph of the finite state machine that is implemented by the associated core.

The FRMs employed in the above description, which are embedded in wrappers, are so depicted for illustrative purposes, and that the FRMs need not be in wrappers. Further, there is no need for creating a number of FRMs that is equal to the number of cores in SoC. Any number of distinct FRMs (though interconnected via "spare leads") can used.

It should be understood that the principles disclosed herein are described with the aid of a number of illustrative embodiments and that, however, the other and significantly different embodiments can be created that still are within the spirit and scope of this invention. For example, the above describes the assertion checking data acquisition circuit (e.g. elements 53, 55, 56) as being created within the FRMs through a configuration of the FRM. That, however, is not a requirement of the invention, and it is quite possible that at least some of the assertion checking data acquisition circuits might be implemented with fixed circuitry rather than reconfigurable circuitry; perhaps includes in all cores as standard elements.

The invention claimed is:

1. An integrated circuit comprising a plurality of two or more cores and a plurality of two or more functionally reconfigurable modules (FRMs) that are coupled to said cores, the improvement comprising:
   a plurality of assertion logic circuits created within said FRMs where each of the assertion logic circuits is configured to check an assertion pertaining to signals developed by the core or cores during operation to which each of the logic circuits is responsive.

2. The integrated circuit of claim 1 where said assertion logic circuits perform assertion checking concurrently.

3. The integrated circuit of claim 1 where said assertion logic circuits operate to check their assertions concurrently, while said cores operate pursuant to a clock a frequency that is within nominal operating range of said integrated circuit.

4. The integrated circuit of claim 1 where said FRMs are configured to create circuits that report results of assertion checks performed by said plurality of logic circuits.

5. The integrated circuit of claim 1 where each of said assertion logic circuits is responsive to parallel input leads and parallel output leads of one or more of said cores.

6. The integrated circuit of claim 1 further comprising a plurality of assertion checking data acquisition circuits, each of which is associated with one of said plurality of cores, and interposed between said plurality of assertion logic circuits and their associated cores.

7. The integrated circuit of claim 6 where said assertion checking data acquisition circuits are configured in whole or in part within said FRM.

8. The integrated circuit of claim 6 where each of said cores has an SO terminal adapted to output signals from a scan chain that is connected to each core's associated assertion checking data acquisition circuit and to a routing circuit and an SI terminal adapted to supply signals to a scan chain that is connected to an output terminal of said routing circuit.

9. The integrated circuit of claim 8 where said assertion checking acquisition circuits are configures, at least in part, within said FRMs.

10. The integrated circuit of claim 8 where each of said assertion checking data acquisition circuits includes a bit extractor that stores information which identifies specific bits to be extracted from data arriving via the SO terminal that is connected to each of said assertion checking data acquisition circuits.

11. The integrated circuit of claim 10 further comprising a register arrangement for storing the extracted data.

12. The integrated circuit of claim 11 where said register arrangement is a single register having a port for serial input of said data to said register.

13. The integrated circuit of claim 11 where additional flip-flops are configured outside the core between its SO and the SI terminals to achieve the same effective length for all the scan chains from which bits are concurrently extracted.

14. The integrated circuit of claim 8 where said routing element of at least one of said FRMs is a multiplexer having one input connected to receive signals from said SO terminal, and a second input lead connected to receive signals from a register.

15. The integrated circuit of claim 14 where said register in configured within said at least one of said FRMs.

16. The integrated circuit of claim 14 where said resister has a serial port connected to said multiplexer.

17. The integrated circuit of claim 14 where said register contains bits to be inserted into the said SI terminal.

18. The integrated circuit of claim 14 where said register is one into which bits extracted by said assertion checking data acquisition circuits respectively associated with said at least one of said cores are installed.

19. The integrated circuit of claim 8 where the assertion checking data acquisition circuit includes a bit injector that stores information which identifies specific bits to be injected into the data going into the SI terminal.

20. The integrated circuit of 6 where the data acquisition circuits are scan chains.

21. The integrated circuit of claim 1 where each of said plurality of assertion logic circuits that is configured to check an assertion outputs an identifier of said assertion when a check of the assertion concludes that the assertion failed.

22. The integrated circuit of claim 21 further comprising circuitry created in said FRMs to output said identifier and to output input signals applied to the assertion logic circuit where a conclusion is reached that the assertion failed.

23. The integrated circuit of claim 21 further comprising circuitry created in said FRMs that raises an alarm when any of said plurality of assertion logic circuits concludes that its assertion failed.

24. The integrated circuit of claim 1 wherein said FRMs are included in wrappers associated with said two or more cores.

* * * * *